(12) United States Patent
Hayashi et al.

(10) Patent No.: US 6,472,079 B2
(45) Date of Patent: Oct. 29, 2002

(54) COMPOSITION FOR FILM FORMATION, METHOD OF FILM FORMATION, AND SILICA-BASED FILM

(75) Inventors: Eiji Hayashi, Ibaraki (JP); Michinori Nishikawa, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/829,954

(22) Filed: Apr. 11, 2001

(65) Prior Publication Data

US 2002/0045693 A1 Apr. 18, 2002

(30) Foreign Application Priority Data

Apr. 17, 2000 (JP) .................................. 2000-115141

(51) Int. Cl.⁷ ............................... B32B 9/041
(52) U.S. Cl. ................ 428/447; 525/342; 525/446; 528/14; 528/21; 528/34; 427/387
(58) Field of Search ................ 428/447; 525/342, 525/446; 528/14, 21, 34; 427/387, 11

(56) References Cited

U.S. PATENT DOCUMENTS 5,733,644 A * 3/1998 Tanaka et al. .............. 428/215

\* cited by examiner

*Primary Examiner*—Robert Dawson
*Assistant Examiner*—Christopher M. Keehan
(74) *Attorney, Agent, or Firm*—Oblon, Spviak, McClelland, Maier & Neustadt, P.C.

(57) ABSTRACT

A composition for film formation which comprises:

(A) a product of hydrolysis and condensation obtained by hydrolyzing and condensing at least one compound selected from the group consisting of (A-1) compounds represented by the following formula (1)

$$R_aSi(OR^1)_{4-a} \tag{1}$$

(A-2) compounds represented by the following formula (2)

$$Si(OR^2)_4 \tag{2}$$

and (A-3) compounds represented by the following formula (3)

$$R^3{}_b(R^4O)_{3-b}Si-(R^7)_d-Si(OR^5)_{3-c}R^6{}_c \tag{3}$$

(B) at least one member selected from the group consisting of compounds of the metals in Groups IA and IIA of the periodic table; and (C) an organic solvent. A method for film formation using the composition and a silica-based film obtained by the method are also disclosed.

8 Claims, No Drawings

COMPOSITION FOR FILM FORMATION, METHOD OF FILM FORMATION, AND SILICA-BASED FILM

FIELD OF THE INVENTION

The present invention relates to a composition for film formation. More particularly, the invention relates to a composition for film formation which, when used as an interlayer insulating film material in the production of semiconductor devices and the like, can be burned in a short time period and give a silica-based film having excellent cracking resistance after a PCT (pressure cooker test).

BACKGROUND OF THE INVENTION

Silica ($SiO_2$) films formed by vacuum processes such as the CVD method have hitherto been used frequently as interlayer insulating films in semiconductor devices and other devices. In recent years, an insulating coating film which comprises a tetraalkoxysilane hydrolyzate as the main component and is called an SOG (spin on glass) film has come to be used for the purpose of forming a more even interlayer insulating film. Furthermore, as a result of the trend toward higher degree of integration in semiconductor devices and the like, an interlayer insulating film called an organic SOG film has been developed which comprises a polyorganosiloxane as the main component and has a low dielectric constant.

With further progress in the degree of integration or multilayer constitution especially in semiconductor devices and the like, better electrical insulation between conductors has come to be required and, hence, an interlayer insulating film material having a lower dielectric constant and excellent cracking resistance has come to be desired.

Proposed as materials having a low dielectric constant are a composition comprising a mixture of fine particles obtained by condensing an alkoxysilane in the presence of ammonia and a basic product of partial hydrolysis of an alkoxysilane (see JP-A-5-263045 (the term "JP-A" as used herein means an "unexamined published Japanese patent application") and JP-A-5-315319) and a coating fluid obtained by condensing a basic hydrolyzate of a polyalkoxysilane in the presence of ammonia (see JP-A-11-340219 and JP-A-11-340220). However, these reaction products have unstable properties and cannot be burned in a short period of time, and the films obtained therefrom have considerable unevenness of properties such as cracking resistance after a PCT. Because of this, the materials obtained by these methods are unsuitable for industrial production.

SUMMARY OF THE INVENTION

Accordingly, one object of the invention is to provide a composition for film formation which eliminates the problems described above. More particularly, the object is to provide a composition for film formation which, when used in the production of semiconductor devices and the like, can be burned in a short time period and give an interlayer insulating film having excellent cracking resistance after a PCT.

Another object of the invention is to provide a silica-based film obtained from the composition The invention provides a composition for film formation which comprises:

(A) a product of hydrolysis and condensation obtained by hydrolyzing and condensing at least one compound selected from the group consisting of (A-1) compounds represented by the following formula (1) (hereinafter referred to as "compounds (1) ")

$$R_a Si(OR^1)_{4-a} \quad (1)$$

wherein R represents a hydrogen atom, a fluorine atom, or a monovalent organic group; $R^1$ represents a monovalent organic group; and a is an integer of 1 or 2, (A-2) compounds represented by the following formula (2) (hereinafter referred to as "compounds (2)")

$$Si(OR^2)_4 \quad (2)$$

wherein $R^2$ represents a monovalent organic group, and (A-3) compounds represented by the following formula (3) (hereinafter referred to as "compounds (3) ")

$$R^3{}_b(R^4O)_{3-b}Si-(R^7)_d-Si(OR^5)_{3-c}R^6{}_c \quad (3)$$
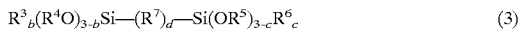

wherein $R^3$ to $R^6$ may be the same or different and each represents a monovalent organic group; b and c may be the same or different and each is an integer of 0 to 2; $R^7$ represents an oxygen atom, a phenylene group, or a group represented by $-(CH_2)_n-$ wherein n is an integer of 1 to 6; and d is 0 or 1;

(B) at least one member selected from the group consisting of compounds of the metals in Groups IA and IIA of the periodic table; and (C) an organic solvent.

The invention further provides a method of film formation which comprises applying the composition for film formation described above to a substrate and then heating the resulting coating.

The invention furthermore provides a silica-based film obtained by the method of film formation described above.

DETAILED DESCRIPTION OF THE INVENTION

The product of hydrolysis and condensation (A) in the invention means a mixture of a hydrolyzate of at least one member selected from the group consisting of the compounds (1) to (3) and a condensate of the hydrolyzate, or means either of the hydrolyzate and the condensate.

In the hydrolyzate in ingredient (A), all the $R^1O-$, $R^2O-$, $R^4O-$, and $R^5O-$ groups contained in compounds (1) to (3) to constitute ingredient (A) need not have been hydrolyzed. For example, the hydrolyzate may be one in which only one of those groups has been hydrolyzed or two or more thereof have been hydrolyzed or may be a mixture of these.

The condensate in ingredient (A) means a product formed from the hydrolyzate of compounds (1) to (3) to constitute ingredient (A) by condensing silanol groups of the hydrolyzate to form Si—O—Si bonds. In the invention, however, all the silanol groups need not have undergone condensation. Namely, the term "condensate" as used herein means a concept which includes, for example, a condensate in which a slight proportion of the silanol groups have been condensed and a mixture of condensates which differ in the degree of condensation.

Product of Hydrolysis and Condensation (A) The product of hydrolysis and condensation (A) is obtained by hydrolyzing and condensing at least one silane compound selected from the group consisting of compounds (1) to (3).

Compounds (1):

Examples of the monovalent organic groups represented by R and $R^1$ in formula (1) include alkyl, aryl, allyl, and glycidyl groups. In formula (1), R is preferably a monovalent organic group, more preferably an alkyl or phenyl group.

The alkyl group preferably has 1 to 5 carbon atoms, and examples thereof include methyl, ethyl, propyl, and butyl. These alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Examples of the compounds represented by formula (1) include: trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltrin-butoxysilane, n-propyltri-sec-utoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-t ert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxyslane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-btyldimethoxysilane, di-sec-butyldiethoxysilane, di-sec-butyldi-n-propoxysilane, di- sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Preferred examples of the compounds (1) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or in combination of two or more thereof.

Compounds (2):

Examples of the monovalent organic group represented by $R^2$ in formula (2) include the same monovalent organic groups as those enumerated above with regard to formula (1).

Examples of the compounds represented by formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3):

Examples of the monovalent organic groups represented by $R^3$ to $R^6$ in formula (3) include the same monovalent organic groups as those enumerated above with regard to formula (1).

Examples of the compounds represented by formula (3) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3- phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethxoxy-1,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane.

Preferred of those compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compounds represented by formula (3) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldiisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldsilane, 1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2-tetraimethyldisilane, 1,2-diethoxy-1,1,2,2-tetraimethyldisilane, 1,2-diphenoxy-1,1,2,2-tetraimethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (3) wherein $R^7$ is a group represented by $-(CH_2)_n-$ include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysi lyl)methane, 1-(di-t-butoxymethylsilyl)-1-(tri-t-butoxysillyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylslyl)ethane, 1,2(dimethoxymethyisilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(trisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysil yl)benzene 1,3-bis(tri-t-butoxysilyl)benzene, 1,4-bis(trimethoxysilyl)benzene, 1,4-bis(triethoxysily)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, and 1,4-bis(tri-t-butoxysilyl)benzene.

Preferred of those compounds are bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

In the invention, the compounds (1), (2), and (3) described above may be used alone or in combination of two or more thereof to constitute ingredient (A).

When at least one silane compound selected from the group consisting of the compounds (1) to (3) for constituting ingredient (A) is hydrolyzed and condensed, it is preferred to use water in an amount of from more than 0.5 mol to 150 mol, more preferably from more than 0.5 mol to 130 mol, per mol of the silane compound. If water is added in an amount of 0.5 mol or smaller, there are cases where the resultant composition gives a coating film having poor cracking resistance. On the other hand, if the amount of water added is larger than 150 mol, there are cases where polymer precipitation or gelation occurs during the hydrolysis and condensation reactions.

The addition of the silane compound to the reaction mixture may be conducted enbloc, or may be conducted continuously or intermittently. In the case where the silane compound is added continuously or intermittently, the period of addition is preferably from 5 minutes to 12 hours.

The production of the product of hydrolysis and condensation (A) for use in the invention is preferable that a catalyst is used in hydrolyzing and condensing at least one silane compound selected from the group consisting of the compounds (1) to (3).

Examples of catalysts which can be used in the hydrolysis and condensation include metal chelate compounds, acid catalysts, and alkali catalysts.

Examples of the metal chelate compounds include titanium chelate compounds such as triethoxymono(acetylacetonato)-titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-t-butoxymono(acetylacetonato)titanium, diethoxybis(acetylacetonato)titanium, di-n-propoxybis(acetylacetonato)titanium, diisopropoxybis(acetylacetonato)titanium, di-n-butoxybis(acetylacetonato)titanium, di-sec-butoxybs(acetylacetonato)titanium, di-t-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-t-butoxytris(acetylacetonato)titanium, tetrakis(acetylacetonato)titanium, triethoxymono(ethyl acetoacetate)titanium, tri-n-propoxymono(ethyl acetoacetate)titanium, trisopropoxymono(ethyl acetoacetate)titanium, tri-n-butoxymono(ethyl acetoacetate)titanium, tri-sec-butoxymono(ethyl acetoacetate)titanium, tri-t-butoxymono(ethyl acetoacetate)titanium, diethoxybis(ethyl acetoacetate)titanium, di-n-propoxybis(ethyl acetoacetate)titanium, disopropoxybis(ethyl acetoacetate)titanium, di-n-butoxybis(ethyl acetoacetate)titanium, di-sec-butoxybis(ethyl acetoacetate)titanium, di-t-butoxybis(ethyl acetoacetate)titanium, monoethoxytris(ethyl acetoacetate)titanium, mono-n-propoxytris(ethyl acetoacetate)titanium, monoisopropoxytris(ethyl acetoacetate)titanium, mono-n-butoxytris(ethyl acetoacetate)titanium, mono-sec-butoxytris(ethyl acetoacetate)titanium, mono-t-butoxytris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium, and tris(acetylacetonato)mono(ethyl acetoacetate)titanium; zirconium chelate compounds such as triethoxymono-(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-t-butoxymono(acetylacetonato)zirconium, diethoxybis(acetylacetonato)zirconium, di-n-propoxybis(acetylacetonato)zirconium, diisopropoxybis(acetylacetonato)zirconium, di-n-butoxybis(acetylacetonato)zirconium, di-sec-butoxybs(acetylacetonato)zirconium, di-t-butoxybis(acetylacetonato)zirconium, monoethoxytris(acetylacetonato)zirconium, mono-n-propoxytris(acetylacetonato)zirconium, monoisopropoxytris(acetylacetonato)zirconium, mono-n-butoxytris(acetylacetonato)zirconium, mono-sec-butoxytris(acetylacetonato)zirconium, mono-t-butoxytris(acetylacetonato)zirconium, tetrakis(acetylacetonato)zirconium, triethoxymono(ethyl acetoacetate)zirconium, tri-n-propoxymono(ethyl acetoacetate)zirconium, triisopropoxymono(ethyl acetoacetate)zirconium, tri-n-butoxymono(ethyl acetoacetate)zirconium, tri-sec-butoxymono(ethyl acetoacetate)zirconium, tri-t-butoxymono(ethyl acetoacetate)zirconium, diethoxybis(ethyl acetoacetate)zirconium, di-n-propoxybis(ethyl acetoacetate)zirconium, diisopropoxybis(ethyl acetoacetate)zirconium, di-n-butoxybis(ethyl acetoacetate)zirconium, di-sec-butoxybis(ethyl acetoacetate)zirconium, di-t-butoxybis(ethyl acetoacetate)zirconium, monoethoxytris(ethyl acetoacetate)zirconium, mono-n-propoxytris(ethyl acetoacetate)zirconium, monoisopropoxytris(ethyl acetoacetate)zirconium, mono-n-butoxytris(ethyl acetoacetate)zirconium, mono-sec-butoxytris(ethyl acetoacetate)zirconium, mono-t-butoxytris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium, and tris(acetylacetonato)mono(ethyl acetoacetate)zirconium; and aluminum chelate compounds such as tris(acetylacetonato)aluminum and tris(ethyl acetoacetate)aluminum. Preferred of these are the chelate compounds of titanium and aluminum. Especially preferred are the chelate compounds of titanium.

Those metal chelate compounds may be used alone or in combination of two or more thereof.

Examples of the acid catalysts include inorganic acids such as hydrochloric acid, nitric acid, sulfuric acid, hydrofluoric acid, phosphoric acid, boric acid, and oxalic acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, itaconic acid, mesaconic acid, citraconic acid, malic acid, a glutaric acid hydrolyzate, a maleic anhydride hydrolyzate, and a phthalic anhydride hydrolyzate Preferred of these are the organic acids.

Those acid catalysts may be used alone or in combination of two or more thereof.

Examples of the alkali catalysts include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine, and 3-amino-3-methylbutane. Preferred of these are the organic amines. Especially preferred from the standpoint of the adhesion of a silica-based film to substrates are ammonia, the alkylamines, and tetramethylammonium hydroxide.

Those alkali catalysts may be used alone or in combination of two or more thereof.

The catalyst may be used in an amount of generally from 0.00001 to 10 mol, preferably from 0.00005 to 5 mol, per mol of the total amount of the $R^1O$—, $R^2O$—, $R^4O$—, and $R^5O$— groups contained in the compounds (1) to (3). As long as the catalyst is used in an amount within that range, polymer precipitation or gelatin is less apt to occur during the reaction.

In ingredient (A), the proportion of the product of hydrolysis and condensation derived from each compound is as follows, in terms of the product of complete hydrolysis and condensation. The content of the product of hydrolysis and condensation derived from the compound (2) is generally from 5 to 75% by weight, preferably from 10 to 70% by weight, more preferably from 15 to 70% by weight, based on the sum of all the products of hydrolysis and condensation derived from the compounds (1) to (3). The content of the product of hydrolysis and condensation derived from the compound (1) and/or compound (3) is generally from 95 to 25% by weight, preferably from 90 to 30% by weight, more preferably from 85 to 30% by weight, based on the sum of all the products of hydrolysis and condensation derived from the compounds (1) to (3). When the content of the product of hydrolysis and condensation derived from the compound (2) is from 5 to 75% by weight based on the sum of all the products of hydrolysis and condensation derived from the compounds (1) to (3), then the coating film obtained has a high modulus of elasticity and an exceedingly low dielectric constant.

The term "product of complete hydrolysis and condensation" as used herein means a product in which all the $R^1O$—, $R^2O$—, $R^4O$—, and $R^5$— groups contained in the compound (1), (2), or (3) have been hydrolyzed into SiOH groups and then completely condensed to form siloxane structures.

Ingredient (A) is preferably a product of the hydrolysis and condensation of a mixture of at least one of the compounds (1) and at least one of the compounds (2), because this ingredient (A) imparts better storage stability to the composition to be obtained.

Ingredient (B)

Ingredient (B) to be used in the invention comprises at least one member selected from the group consisting of compounds of the metals in Groups IA and IIA of the periodic table, and is preferably a compound of at least one metal selected from the group consisting of potassium, rubidium, cesium, beryllium, magnesium, calcium, strontium, and barium.

Examples of ingredient (B) include potassium compounds such as potassium acetate, potassiummaleate, potassium oxalate, potassium itaconate, potassium fumarate, potassium malonate, potassium phthalate, potassium tartarate, potassium succinate, potassium mesaconate, potassium citraconate, potassium malate, potassium aluminate, potassium aluminum sulfate, potassium aurous cyanide, potassium benzoate, potassium bicarbonate, potassiumbiiodate, potassiumbioxalate, potassiumbiphthalate, potassium bisulfate, potassium bisulfite, potassium bitartarate, potassium borate, potassium boron hydride, potassium bromate, potassium t-butoxide, potassium carbonate, potassium chlorate, potassium chloride, potassium chloroplatinate, potassium chromate, potassium citrate, potassium cyanate, potassium cyclohexanebutyrate, potassium dichromate, potassium dicyanoargenate, potassium dihydrogen citrate, potassium dihydrogen phosphate, potassium 2,5-dihydroxy-1,4-benzenesulfonate, potassium disulfide, potassium O-ethyl dithiocarbonate, potassium ethylxanthate, potassiumethylxanthogenate, potassiumferricyanide, potassium ferrocyanide, potassium formate, potassium gluconate, potassium cyanoaurate, potassium hexachloroplatinate, potassium 2,4-hexadienoate, potassium hexafluorophosphate, potassium hexafluorosilicate, potassium hexafluorozirconate, potassium hexahydroxoantimonate, potassium hydride, potassium hydrogen carbonate, dipotassium hydrogen citrate, potassium hydrogen iodate, potassium hydrogen oxalate, dipotassium hydrogen phosphate, potassium hydrogen phthalate, potassium hydrogen sulfate, potassium hydrogen sulfite, potassium hydrogen tartarate, dipotassium hydroquinone-2, 5-disulfonate, potassium hydrosulfide, potassium hydroxide, potassium hydrochlorite, potassium lactate, potassium laurate, potassium malate, potassium metaborate, potassium metaperiodate, potassium metaphosphate, potassium methoxide, potassium nickel cyanide, potassium nitrate, potassium nitrite, potassium nonafluoro-1-butanesulfonate, potassium oleate, potassium oxalate, potassium palladium chloride, potassium palmitate, potassium perchlorate, potassium periodate, potassium permanganate, potassiumperoxodisulfate, potassiumpersulfate, dipotassium phosphate, tripotassium phosphate, dipotassium phosphite, dipotassium phosphonate, potassium phthalate, potassium phthalimide, potassium picrate, potassium platinum chloride, potassium pyrophosphate, potassium pyrosulfate, potassium pyrosulfite, dipotassium rhodizonate, potassium selenite, potassium silicate, potassium sodium carbonate, potassium sodium tartarate, potassium sorbate, potassium stannate, potassium stearate, potassium succinate, potassium sulfate, potassium sulfide, potassium sulfite, potassium p-sulfobenzoate, potassium tellurate, potassium tellurite, potassium tetraborate, potassium tetrachloropalladate, potassium tetrachloroplatinate, potassium tetracyanonickelate, potassium mercury tetraiodide, potassium tetraoxalate, potassium thiocyanate, potassium thiosulfate, potassium titanium fluoride, potassium titanium oxalate, potassium trichloro(ethylene)platinate, potassium 2,4,6-trinitrophenolate, potassiumxanthogenate, and potassium zirconium fluoride; rubidium compounds such as rubidium acetate, rubidium maleate, rubidium oxalate, rubidium itaconate, rubidium fumarate, rubidium malonate, rubidium phthalate, rubidium tartarate, rubidium succinate, rubidium mesaconate, rubidium citraconate, rubidium malate, rubidium aluminate, rubidium aluminum sulfate, rubidium aurous cyanide, rubidium benzoate, rubidium bicarbonate, rubidium biiodate, rubidium bioxalate, rubidium biphthalate, rubidium bisulfate, rubidium bisulfite, rubidium bitartarate, rubidium borate, rubidium boron hydride, rubidium bromate, rubidium t-butoxide, rubidium carbonate, rubidium chlorate, rubidium chloride, rubidium chloroplatinate, rubidium chromate, rubidium citrate, rubidium cyanate, rubidium cyclohexanebutyrate, rubidium dichromate, rubidium dicyanoargenate, rubidium dihydrogen citrate, rubidium dihydrogen phosphate, rubidium 2,5-dihydroxy-1,4-benzenesulfonate, rubidium disulfide, rubidium O-ethyl dithiocarbonate, rubidium ethylxanthate, rubidium ethylxanthogenate, rubidium ferricyanide, rubidium ferrocyanide, rubidium formate, rubidium gluconate, rubidium cyanoaurate, rubidium hexachloroplatinate, rubidium 2,4-hexadienoate, rubidium hexafluorophosphate, rubidium hexafluorosilicate, rubidium hexafluorozirconate, rubidium hexahydroxoantimonate, rubidium hydride, rubidium hydrogen carbonate, dirubidium hydrogen citrate, rubidium hydrogen iodate, rubidium hydrogen oxalate, dirubidium hydrogen phosphate, rubidium hydrogen phthalate, rubidium hydrogen sulfate, rubidium hydrogen sulfite, rubidium hydrogen tartarate, dirubidium hydroquinone-2,5-disulfonate, rubidium hydrosulfide, rubidium hydroxide, rubidium hydrochlorite, rubidium lactate, rubidium laurate, rubidium malate, rubidium metaborate, rubidium metaperiodate, rubidium metaphosphate, rubidium methoxide, rubidium nickel cyanide, rubidium nitrate, rubidium nitrite, rubidium nonafluoro-1-butanesulfonate, rubidium oleate, rubidium oxalate, rubidium palladium chloride, rubidium palmitate, rubidium perchlorate, rubidium periodate, rubidium permanganate, rubidium peroxodisulfate, rubidium persulfate, dirubidium phosphate, trirubidium phosphate, dirubidium phosphite, dirubidium phosphonate, rubidium phthalate, rubidium phthalimide, rubidium picrate, rubidium platinum chloride, rubidium pyrophosphate, rubidium pyrosulfate, rubidium pyrosulfite, dirubidium rhodizonate, rubidium selenite, rubidium silicate, rubidium sodium carbonate, rubidium sodium tartarate, rubidium sorbate, rubidium stannate, rubidium stearate, rubidium succinate, rubidium sulfate, rubidium sulfide, rubidium sulfite, rubidium p-sulfobenzoate, rubidium tellurate, rubidium tellurite, rubidium tetraborate, rubidium tetrachloropalladate, rubidium tetrachloroplatinate, rubidium tetracyanonickelate, rubidium mercury tetraiodide, rubidium tetraoxalate, rubidium thiocyanate, rubidium thiosulfate, rubidium titanium fluoride, rubidium titanium oxalate, rubidium trichloro(ethylene)platinate, rubidium 2,4,6-trinitrophenolate, rubidium xanthogenate, and rubidium zirconium fluoride; cesium compounds such as cesium acetate, cesium maleate, cesium oxalate, cesium itaconate, cesium fumarate, cesium malonate, cesium phthalate, cesium tartarate, cesium succinate, cesium mesaconate, cesiumcitraconate, cesiummalate, cesium aluminate, cesium aluminum sulfate, cesium aurous cyanide, cesium benzoate, cesium bicarbonate, cesium biiodate, cesium bioxalate, cesium biphthalate, cesium bisulfate, cesium bisulfite, cesium bitartarate, cesium borate, cesium boron hydride, cesium bromate, cesium t-butoxide, cesium carbonate, cesium chlorate, cesium chloride, cesium chloroplatinate, cesium chromate, cesium citrate, cesium cyanate, cesium cyclohexanebutyrate, cesium dichromate, cesium dicyanoargenate, cesium dihydrogen citrate, cesium dihydrogen phosphate, cesium 2,5-dihydroxy-1,4-benzenesulfonate, cesium disulfide, cesium O-ethyl dithiocarbonate, cesium ethylxanthate, cesium ethylxanthogenate, cesium ferricyanide, cesium ferrocyanide, cesium formate, cesium gluconate, cesium cyanoaurate, cesium hexachloroplatinate, cesium 2,4-hexadienoate, cesium hexafluorophosphate, cesium hexafluorosilicate, cesium hexafluorozirconate, cesium hexahydroxoantimonate, cesium hydride, cesium hydrogen carbonate, dicesium hydrogen citrate, cesium hydrogen iodate, cesium hydrogen oxalate, dicesium hydrogen phosphate, cesium hydrogen phthalate, cesium hydrogen sulfate, cesium hydrogen sulfite, cesium hydrogen tartarate, dicesium hydroquinone-2,5-disulfonate, cesium hydrosulfide, cesium hydroxide, cesium hydrochlorite, cesium lactate, cesium laurate, cesium malate, cesium metaborate, cesium metaperiodate, cesium metaphosphate, cesium methoxide, cesium nickel cyanide, cesium nitrate, cesium nitrite, cesium nonafluoro-1-butanesulfonate, cesium oleate, cesium oxalate, cesium palladium chloride, cesium palmitate, cesium perchlorate, cesium periodate, cesium permanganate, cesium peroxodisulfate, cesium persulfate, dicesium phosphate, tricesium phosphate, dicesium phosphite, dicesium phosphonate, cesium phthalate, cesium phthalimide, cesium picrate, cesium platinum chloride, cesium pyrophosphate, cesium pyrosulfate, cesium pyrosulfite, dicesium rhodizonate, cesium selenite, cesium silicate, cesium sodium carbonate, cesium sodium tartarate, cesium sorbate, cesium stannate, cesium stearate, cesium succinate, cesium sulfate, cesium sulfide, cesium sulfite, cesiump-sulfobenzoate, cesium tellurate, cesium tellurite, cesium tetraborate, cesium tetrachloropalladate, cesium tetrachloroplatinate, cesium tetracyanonickelate, cesium mercury tetraiodide, cesium tetraoxalate, cesium thiocyanate, cesium thiosulfate, cesium titanium fluoride, cesium titanium oxalate, cesium trichloro (ethylene) platinate, cesium 2,4,6-trinitrophenolate, cesium xanthogenate, and cesium zirconium fluoride; magnesium compounds such as magnesium acetate, magnesium maleate, magnesium oxalate, magnesium itaconate, magnesium fumarate, magnesium malonate, magnesium phthalate, magnesium tartarate, magnesium succinate, magnesium mesaconate, magnesium citraconate, magnesium malate, magnesium ammonium phosphate, magnesium ammonium sulfate, magnesium benzoate, magnesium bromide, magnesium carbonate hydroxide, magnesium chloride, magnesium chromate, magnesium dimethoxide, magnesium di(methoxyethoxide), magnesium diethoxide, magnesium hexafluorosilicate, magnesium hydrogen phosphate, magnesium hydroxide, magnesium hydrogen hydroxide, magnesium lactate, magnesium methoxide methylcarbonate, magnesium methoxide ethoxide, methylmagnesium carbonate, magnesium nitrate, magnesium oleate, magnesium oxalate, magnesium oxide, magnesium perchlorate, magnesium phosphate, magnesium silicofluoride, magnesium stearate, magnesium succinate, and magnesium sulfate; beryllium compounds such as beryllium acetate, beryllium ammonium phosphate, beryllium ammonium sulfate, beryllium benzoate, beryllium bromide, beryllium carbonate hydroxide, beryllium chloride, beryllium chromate, beryllium dimethoxide, berylliumdi(methoxyethoxide), berylliumdiethoxide, beryllium hexafluorosilicate, beryllium hydrogen phosphate, beryllium hydroxide, beryllium hydrogen hydroxide, beryllium lactate, beryllium methoxide methylcarbonate, beryllium methoxide ethoxide, methylberyllium carbonate, beryllium nitrate, beryllium oleate, beryllium oxalate, beryllium oxide, beryllium perchlorate, beryllium phosphate, beryllium silicofluoride, beryllium stearate, beryllium succinate, and beryllium sulfate; calcium compounds such as calcium acetate, calcium maleate, calcium oxalate, calcium itaconate, calcium fumarate, calcium malonate, calcium phthalate, calcium tartarate, calcium succinate, calcium mesaconate, calcium citraconate, calcium malate, calcium ammonium phosphate, calcium ammonium sulfate, calcium benzoate, calcium bromide, calcium carbonate hydroxide, calcium chloride, calcium chromate, calcium dimethoxide, calcium di(methoxyethoxide), calcium diethoxide, calcium hexafluorosilicate, calcium hydrogen phosphate, calcium hydroxide, calcium hydrogen hydroxide, calcium lactate, calcium methoxide methylcarbonate, calcium methoxide ethoxide, methylcalcium carbonate, calcium nitrate, calcium oleate, calcium oxalate, calcium oxide, calcium perchlorate, calcium phosphate, calcium silicofluoride, calcium stearate, calcium succinate, and calcium sulfate; strontium compounds such as strontium acetate, strontium maleate, strontium oxalate, strontium itaconate, strontium fumarate, strontium malonate, strontium phthalate, strontium tartarate, strontium succinate, strontium mesaconate, strontium citraconate, strontium malate, strontium ammonium phosphate, strontium ammonium sulfate, strontium benzoate, strontium bromide, strontium carbonate hydroxide, strontium chloride, strontium chromate, strontium dimethoxide, strontium di(methoxyethoxide), strontium diethoxide, strontium hexafluorosilicate, strontium hydrogen phosphate, strontium hydroxide, strontium hydrogen hydroxide, strontium lactate, strontium methoxide methylcarbonate, strontium methoxide ethoxide, methylstrontium carbonate, strontium nitrate, strontium oleate, strontium oxalate, strontium oxide, strontium perchlorate, strontium phosphate, strontium silicofluoride, strontium stearate, strontium succinate, and strontium sulfate; and barium compounds such as barium acetate, barium maleate, barium oxalate, barium itaconate, barium fumarate, barium malonate, barium phthalate, barium tartarate, barium succinate, barium mesaconate, barium citraconate, barium malate, barium ammonium phosphate, barium ammonium sulfate, barium benzoate, barium bromide, barium carbonate hydroxide, barium chloride, barium chromate, barium dimethoxide, barium di(methoxyethoxide), barium diethoxide, barium hexafluorosilicate, barium hydrogen phosphate, barium hydroxide, barium hydrogen hydroxide, barium lactate, barium methoxide methylcarbonate, barium methoxide ethoxide, methylbarium carbonate, barium nitrate, barium oleate, barium oxalate, barium oxide, barium perchlorate, barium phosphate, barium silicofluoride, barium stearate, barium succinate, and barium sulfate.

Especially preferred of the metal compounds enumerated above are organic acid salts such as the oxalates, maleates, itaconates, fumarates, malonates, phthalates, tartarates, succinates, mesaconates, citraconates, malates, citrates, acetates, and lactates.

The amount of ingredient (B) in the composition for film formation is generally from 0.0001 to 0.015 parts by weight, preferably from 0.0002 to 0.01 part by weight, per 100 parts by weight of ingredient (A) (in terms of the product of complete hydrolysis and condensation). If the content of ingredient (B) is lower than 0.0001 part by weight, there are cases where the coating film formed from the composition is difficult to burn in a short time period. If the content thereof exceeds 0.015 parts by weight, there are cases where the solution has poor applicability.

A combination of two or more of those metal compounds may be used as ingredient (B).

Organic Solvent (C)

The composition for film formation of the invention comprises ingredients (A) and (B) usually dissolved or dispersed in an organic solvent (C).

This organic solvent (C) may comprise at least one member selected from the group consisting of alcohol solvents, ketone solvents, amide solvents, ester solvents, and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecylalcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents maybe used alone or in combination of two or more thereof.

Examples of the amide solvents include formamide, N-methylformamide, N,N-dimethylformamide, N-ethylformamide, N,N-diethylformamide, acetamide, N-methylacetamide, N, N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methyl-$\Delta^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

Especially preferred of the organic solvents enumerated above are organic solvents represented by the following formula (4):

$$R^8O(CHCH_3CH_2O)_eR^9 \quad (4)$$

wherein $R^8$ and $R^9$ each independently represents a hydrogen atom or a monovalent organic group selected from the group consisting of alkyl groups having 1 to 4 carbon atoms and $CH_3CO$—; and e is an integer of 1 or 2.

Those organic solvents (C) may be used alone or as a mixture of two or more thereof.

In hydrolyzing and/or condensing the compounds (1) to (3) for constituting ingredient (A) in producing the composition for film formation of the invention, the same solvents as those enumerated above can be used.

An example of processes for producing the composition of the invention is as follows. Water or solvent-diluted water is added intermittently or continuously to a solvent containing the compounds (1) to (3) dissolved therein. In this operation, a catalyst may be added beforehand to the solvent or may be dissolved or dispersed in the water prior to the addition of the water. The reaction temperature in this case is generally from 0 to 100° C., preferably from 15 to 90° C.

Other Additives

Ingredients such as β-diketones, colloidal silica, colloidal alumina, organic polymers, surfactants, silane coupling agents, radical generators, and triazene compounds may be added to the composition for film formation obtained in the invention.

Examples of the β-diketones include acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione. Preferred of these are acetylacetone, 2,4-hexanedione, 2,4-heptanedione, and 3,5-heptanedione.

Those β-diketones may be used alone or in combination of two or more thereof.

The colloidal silica is a dispersion comprising, for example, any of the aforementioned hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd. and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the organic polymers include compounds having a sugar chain structure, vinyl amide polymers, (meth) acrylic polymers, aromatic vinyl compounds, dendrimers, polyimides, poly(amic acid)s, polyarylenes, polyamides, polyquinoxaline, polyoxadiazole, fluoropolymers, and compounds having a poly(alkylene oxide) structure.

Examples of the compounds having a poly (alkylene oxide) structure include compounds having a poly (methylene oxide) structure, poly(ethylene oxide) structure, poly(propylene oxide) structure, poly(tetramethylene oxide) structure, poly(butylene oxide) structure, or the like.

Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and sucrose fatty acid esters.

Examples of the polyoxyethylene/polyoxypropylene block copolymers include compounds having either of the following block structures:

—(X)$_j$—(Y)$_k$—

—(X)$_j$—(Y)$_k$—(X)$_l$— wherein X represents —$CH_2CH_2O$—; Y represents —$CH_2CH(CH_3)O$—; j is a number of 1 to 90; k is a number of 10 to 99; and 1 is a number of 0 to 90.

More preferred of those compounds enumerated above are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those compounds may be used alone or in combination of two or more thereof.

Examples of the surfactants include nonionic surfactants, anionic surfactants, cationic surfactants, and amphoteric surfactants, and further include fluorochemical surfactants, silicone surfactants, poly(alkylene oxide) surfactants, and poly (meth) acrylate surfactants. Preferred of these are fluorochemical surfactants and silicone surfactants.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di(1,1,2,2-tetrafluorobutyl) ether, hexaethylene glycol 1,1,2,2,3,3-hexafluoropentyl ether, octapropylene glycol di(1,1,2,2-tetrafluorobutyl) ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-[3-perfluorooctanesulfonamido)propyl]-N,N'-dimethyl-N-car boxymethylene ammonium betaine, perfluoroalkylsulfonamidopropyltrimethyl ammonium salts, perfluoroalkyl-N-ethylsulfonyl glycine salts, bis (N-perfluorooctylsulfonyl-N-ethylaminoethyl) phosphate, and monoperfluoroalkylethyl phosphates.

Commercially available products of such fluorochemical surfactants include products available under the trade names of MegafacF142D, F172, F173, andF183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710andSurflonS-382, SC-101, SC-102, SC-103, SC-104, SC-105, and SC-106 (manufactured by Asahi Glass Co., Ltd.); BM-1000 and BM-1100 (manufactured by Yusho K.K.); and NBX-15 (manufactured by NEOS Co., Ltd.). Especially preferred of these are Megafac F172, BM-1000, BM-1100, and NBX-15.

Examples of the silicone surfactants include SH7PA, SH21PA, SH30PA, and ST94PA (all manufactured by Dow Corning Toray Silicone Co., Ltd.). Especially preferred of these are SH28PA and SH30PA.

The amount of such a surfactant to be used is usually from 0.0001 to 10 parts by weight per 100 parts by weight of ingredient (A) (in terms of the product of complete hydrolysis and condensation)

Those surfactants may be used alone or in combination of two or more thereof.

Examples of the silane coupling agents include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxyslane, N-ethoxycarbonyl-3-aminopropyltriethoxysilane, N-trimethoxysilylpropyltriethylenetriamine, N-trimethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane.

Those silane coupling agents may be used alone or in combination of two or more thereof.

Examples of the radical generators include isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexylperoxydicarbonate, t-hexylperoxyneodecanoate, dimethoxybutyl peroxydicarbonate, di(3-methyl-3-methoxybutyl) peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy)hexane, t-butyl peroxyacetate, 2,2-bis(t-butylperoxy)butane, t-butyl peroxybenzoate, n-butyl 4,4-bis(t-butylperoxy)valerate, di-t-butyl peroxyisophthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane.

The amount of such a radial generator to be added is preferably from 0.1 to 10 parts by weight per 100 parts by weight of the polymer. Those radical generators may be used alone or in combination of two or more thereof.

Examples of the triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriaz enyl)phenyl]fluorene, 2,7-bis(3,3-dimethyltriazenyl)-9,9-bis[3-methyl-4-(3,3-dime thyltriazenyl)phenyl]fluorene, 2,7-bis(3,3-dimethyltriazenyl)-9,9-bis[3-phenyl-4-(3,3-dime thyltriazenyl)phenyl]fluorene, 2,7-bis(3,3-dimethyltriazenyl)-9,9-bis[3-propenyl-4-(3,3-di methyltriazenyl)phenyl]fluorene, 2,7-bis(3,3-dimethyltriazenyl)-9,9-bis[3-fluoro-4-(3,3-dime thyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]fluorene.

Those triazene compounds may be used alone or in combination of two or more thereof.

The composition of the invention thus obtained has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

The total solid concentration of the composition is regulated, according to need, by means of concentration or dilution with the organic solvent (C).

For applying the composition of the invention to a substrate such as a silicon wafer, $SiO_2$ wafer, or SiN wafer, use may be made of a coating technique such as spin coating, dip coating, roll coating, or spraying.

This coating operation can be conducted so as to form a coating film having a thickness on a dry basis of about from 0.05 to 2.5 μm in the case of single coating or about from 0.1 to 5.0 μm in the case of double coating. Thereafter, the wet coating film may be dried at ordinary temperature or dried with heating at a temperature of about from 80 to 600° C. usually for about from 5 to 240 minutes. Thus, a vitreous or macromolecular insulating film can be formed.

In this operation, heating can be conducted with a hot plate, oven, furnace, or the like, for example, in the air, in a nitrogen or argon atmosphere, under vacuum, or under reduced pressure having a controlled oxygen concentration.

Irradiation with electron beams or ultraviolet also can be used for forming a coating film.

In order to control the curing rate of the coating film, stepwise heating or a suitably selected atmosphere, such as a nitrogen, air, oxygen, or reduced-pressure atmosphere, can be used according to need.

The silica-based film of the invention has a dielectric constant of generally from 3.0 to 1.2, preferably from 3.0 to 1.8, more preferably from 3.0 to 2.0.

The interlayer insulating film thus obtained is one capable of being formed through short-term burning and has excellent cracking resistance after a PCT. Consequently, this coating film is useful in applications such as interlayer insulating films or etching stopper films for semiconductor devices such as LSIs, system LSIs, DRAMs, SDRAMs, RDRAMs, and D-RDRAMs, protective films such as surface coat films for semiconductor devices, interlayers for use in semiconductor production processes employing a multilayered resist, interlayer insulating films for multilayered printed circuit boards, and protective or insulating films for liquid-crystal display devices.

The invention will be explained below in more detail by reference to the following Examples. However, the following description merely shows general embodiment examples of the invention, and it should be understood that the invention is not construed as being limited by the description without particular reasons.

In the following Examples and Comparative Examples, all "parts" and "percents" are by weight unless otherwise indicated.

Various properties were evaluated by the following methods.

Weight-average Molecular Weight (Mw)

Measured by gel permeation chromatography (GPC) under the following conditions.

Sample: One gram of a product of hydrolysis and condensation was dissolved in 100 cc of tetrahydrofuran as a solvent to prepare a sample.

Standard polystyrene: Standard polystyrene manufactured by Pressure Chemical, U.S.A. was used.

Apparatus: A high-performance gel permeation chromatograph for high-temperature use (Model 150-C ALC/GPC) manufactured by Waters Inc., U.S.A.

Column: SHODEX A-80M (length, 50 cm), manufactured by Showa Denko K.K.

Measuring temperature: 40° C.

Flow rate: 1 cc/min

Dielectric Constant

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then burned on a 420° C. hot plate in a nitrogen atmosphere for 8 minutes. On the film obtained was formed an aluminum electrode pattern by vapor deposition. Thus, a sample for dielectric constant measurement was produced. This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Cracking Resistance after PCT

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then burned on a 420° C. hot plate in a nitrogen atmosphere for 8 minutes. This coating operation was conducted so as to result in a coating film thickness of 1.5 μm. The film obtained was subjected to a 1-hour PCT under the conditions of 100° C., 100% RH, and 2 atm. The coating film obtained was partly incised with a knife and then immersed in pure water for 4 hours. Thereafter, the incision of the coating film was examined with a microscope to evaluate cracking resistance based on the following criteria.

○: No crack propagation was observed.

×: Crack propagation was observed.

SYNTHESIS EXAMPLE 1

In 290 g of distilled propylene glycol monopropyl ether placed in a separable quartz flask were dissolved 77.04 g of distilled methyltrimethoxysilane, 24.05 g of distilled tetramethoxysilane, and 0.48 g of distilled tetrakis (acetylacetonato)titanium. This solution was stirred with a Three-One Motor and the temperature thereof was kept at 60° C. Subsequently, 84 g of ion-exchanged water was added to the solution over 1 hour and the resultant mixture was reacted at 60° C. for 2 hours. Thereafter, 25 g of distilled acetylacetone was added thereto and the resultant reaction mixture was reacted for 30 minutes and then cooled to room temperature. From this reaction mixture was removed 149 g of a solution comprising methanol and water by evaporation at 50° C. Thus, a reaction mixture (1) was obtained.

The product of condensation and other reactions thus obtained had a weight-average molecular weight of 8,900. This solution was examined by atomic absorption spectrophotometry for the content of compounds of the metals in Groups IA and IIA of the periodic table. As a result, the content thereof was found to be 1 ppb or lower (below the detection limit for atomic absorption spectrophotometry).

SYNTHESIS EXAMPLE 2

In 426 g of distilled propylene glycol monopropyl ether placed in a separable quartz flask were dissolved 205.50 g of distilled methyltrimethoxysilane and 85.51 g of distilled tetramethoxysilane. This solution was stirred with a Three-One Motor and the temperature thereof was kept at 60° C. Subsequently, 182 g of ion-exchanged water containing 0.013 g of maleic anhydride dissolved therein was added to the solution over 1 hour and the resultant reaction mixture was reacted at 60° C. for 2 hours and then cooled to room temperature. From this reaction mixture was removed 360 g of a solution containing methanol by evaporation at 50° C. Thus, a reaction mixture (2) was obtained.

The product of condensation and other reactions thus obtained had a weight-average molecular weight of 1,000. This solution was examined by atomic absorption spectrophotometry for the content of compounds of the metals in Groups IA and IIA of the periodic table. As a result, the content thereof was found to be 1 ppb or lower (below the detection limit for atomic absorption spectrophotometry).

SYNTHESIS EXAMPLE 3

Into a separable flask made of quartz were introduced 570 g of distilled ethanol, 160 g of ion-exchanged water, and 90 g of a 10% solution of distilled dimethylamine in ion-exchanged water. The contents were stirred and homogenized. To this solution was added over 30 minutes a mixture of 13.6 g of distilled methyltrimethoxysilane and 20.9 g of distilled tetraethoxysilane. The resultant solution was reacted for 2 hours while being kept at 65° C. To this solution was added 3,000 g of distilled propylene glycol monopropyl ether. Subsequently, the resultant solution was concentrated with a 50° C. evaporator until the concentration thereof reached 10% (in terms of the content of the product of complete hydrolysis and condensation). Thereafter, a 10% maleic acid solution in distilled propylene glycol was added to the concentrated solution to adjust the pH thereof to 4. Thus, a reaction mixture (3) was obtained.

The product of condensation and other reactions thus obtained had a weight-average molecular weight of 993,000. This solution was examined by atomic absorption spectrophotometry for the content of compounds of the metals in Groups IA and IIA of the periodic table. As a result, the content thereof was found to be 1 ppb or lower (below the detection limit for atomic absorption spectrophotometry).

SYNTHESIS EXAMPLE 4

Into a separable flask made of quartz were introduced 470.9 g of distilled ethanol, 226.5 g of ion-exchanged water, and 17.2 g of 25% aqueous tetramethylammoniumhydroxide solution. The contents were stirred and homogenized. To this solution was added a mixture of 44.9 g of methyltrimethoxysilane and 68.6 g of tetraethoxysilane. The resultant solution was reacted for 2 hours while being kept at 58° C. To this solution was added 50 g of 20% aqueous nitric acid solution. The resultant mixture was sufficiently stirred and then cooled to room temperature. To this solution was added 400 g of propylene glycol monopropyl ether. Subsequently, the resultant solution was concentrated with a 50° C. evaporator until the concentration thereof reached 10% (in terms of the content of the product of complete hydrolysis and condensation). Thereafter, a 10% maleic acid solution in distilled propylene glycol was added to the concentrated solution to adjust the pH thereof to 3. Thus, a reaction mixture (4) was obtained.

The product of condensation and other reactions thus obtained had a weight-average molecular weight of 902,000. This solution was examined by atomic absorption spectrophotometry for the content of compounds of the metals in Groups IA and IIA of the periodic table. As a result, the content thereof was found to be 1 ppb or lower (below the detection limit for atomic absorption spectrophotometry).

SYNTHESIS EXAMPLE 5

Into a separable flask made of quartz were introduced 470.9 g of distilled ethanol, 226.5 g of ion-exchanged water, and 17.2 g of 25% aqueous tetramethylammoniumhydroxide solution. The contents were stirred and homogenized. To this solution was added over 2 hours a mixture of 44.9 g of methyltrimethoxysilane and 68.6 g of tetraethoxysilane. The resultant solution was reacted for 6 hours while being kept at 58° C. To this solution was added 50 g of 20% aqueous nitric acid solution. The resultant mixture was sufficiently stirred and then cooled to room temperature. To this solution was added 400 g of propylene glycol monopropylether. Subsequently, the resultant solution was concentrated with a 50° C. evaporator until the concentration thereof reached 10% (in terms of the content of the product of complete hydrolysis and condensation). Thereafter, a 10% maleic acid solution in distilled propylene glycol was added to the concentrated solution to adjust the pH thereof to 3. Thus, a reaction mixture (5) was obtained.

The product of condensation and other reactions thus obtained had a weight-average molecular weight of 802,000. This solution was examined by atomic absorption spectrophotometry for the content of compounds of the metals in Groups IA and IIA of the periodic table. As a result, the content thereof was found to be 1 ppb or lower (below the detection limit for atomic absorption spectrophotometry).

EXAMPLE 1

To 100 g of the reaction mixture (1) obtained in Synthesis Example 1 was added 0.1 g of ion-exchanged water containing 0.0002 g of potassium lactate dissolved therein. This mixture was sufficiently stirred. The resultant solution was filtered through a Teflon filter having an opening diameter of 0.2 μm to obtain a composition for film formation of the invention.

The composition obtained was applied to a silicon wafer by spin coating.

The resulting coating film had a dielectric constant as low as 2.62. Even when this coating film which had undergone the PCT was immersed in water, no crack propagation was observed.

EXAMPLES 2 TO 9

Compositions for film formation were produced and evaluated in the same manner as in Example 1, except that the reaction mixtures shown in Table 1 were used in place of the reaction mixture (1) and that the ingredients (B) shown in Table 1 were used in place of potassium lactate. The results of evaluation obtained are shown in the Table below.

TABLE

| Example | Ingredient (A) | Ingredient (B) | | Dielectric constant | Cracking resistance after PCT |
|---|---|---|---|---|---|
| 1 | Reaction mixture (1) 100 g | Potassium lactate | 0.0002 g | 2.62 | ○ |
| 2 | Reaction mixture (1) 100 g | Rubidium carbonate | 0.0002 g | 2.63 | ○ |
| 3 | Reaction mixture (2) 100 g | Cesium oxalate | 0.0002 g | 2.71 | ○ |
| 4 | Reaction mixture (2) 100 g | Magnesium carbonate | 0.0002 g | 2.75 | ○ |
| 5 | Reaction mixture (1) 100 g | Beryllium oxalate | 0.0002 g | 2.65 | ○ |

TABLE-continued

| Example | Ingredient (A) | Ingredient (B) | | Dielectric constant | Cracking resistance after PCT |
|---|---|---|---|---|---|
| 6 | Reaction mixture (1) 100 g | Calcium carbonate | 0.0002 g | 2.66 | ○ |
| 7 | Reaction mixture (3) 100 g | Strontium lactate | 0.0001 g | 2.18 | ○ |
| 8 | Reaction mixture (3) 100 g | Barium carbonate | 0.0001 g | 2.20 | ○ |
| 9 | Reaction mixture (3) 100 g | Potassium lactate | 0.0002 g | 2.15 | ○ |
| 10 | Reaction mixture (4) 100 g | Potassium maleate | 0.0001 g | 2.16 | ○ |
| 11 | Reaction mixture (4) 100 g | Potassium succinate | 0.0002 g | 2.17 | ○ |
| 12 | Reaction mixture (5) 100 g | Potassium maleate | 0.0002 g | 2.10 | ○ |
| 13 | Reaction mixture (5) 100 g | Potassium lactate | 0.0002 g | 2.11 | ○ |

COMPARATIVE EXAMPLE 1

A coating film was formed and evaluated in the same manner as in Example 1, except that the reaction mixture (1) obtained in Synthesis Example 1 was used alone.

This coating film had a dielectric constant as high as 3.16. The coating film which had undergone the PCT was immersed in water. As a result, crack propagation was observed.

COMPARATIVE EXAMPLE 2

A coating film was formed and evaluated in the same manner as in Example 1, except that the reaction mixture (2) obtained in Synthesis Example 2 was used alone.

This coating film had a dielectric constant as high as 3.34. The coating film which had undergone the PCT was immersed in water. As a result, crack propagation was observed.

COMPARATIVE EXAMPLE 3

A coating film was formed and evaluated in the same manner as in Example 1, except that 0.0002 g of zinc acetate was added to 100 g of the reaction mixture (1) obtained in Synthesis Example 1.

This coating film had a dielectric constant as high as 3.12. The coating film which had undergone the PCT was immersed in water. As a result, crack propagation was observed.

According to the invention, a composition for film formation (interlayer insulating film material) which can be burned in a short time period and give a coating film having excellent cracking resistance after a PCT can be provided by adding a specific metal compound to a polymer obtained by alkoxysilane hydrolysis.

What is claimed is:

1. A composition for film formation which comprises:
(A) a product of hydrolysis and condensation obtained by hydrolyzing and condensing at least one compound selected from the group consisting of (A-1) compounds represented by the following formula (1)

$$R_a Si(OR^1)_{4-a} \quad (1)$$

wherein R represents a hydrogen atom, a fluorine atom, or a monovalent organic group; $R^1$ represents a monovalent organic group; and a is an integer of 1 or 2, (A-2) compounds represented by the following formula (2)

$$Si(OR^2)_4 \quad (2)$$

wherein $R^2$ represents a monovalent organic group, and (A-3) compounds represented by the following formula (3)

$$R^3{}_b(R^4O)_{3-b}Si\text{—}(R^7)_d\text{—}Si(OR^5)_{3-c}R^6{}_c \quad (3)$$

wherein $R^3$ to $R^6$ may be the same or different and each represents a monovalent organic group; b and c may be the same or different and each is an integer of 0 to 2; $R^7$ represents an oxygen atom, a phenylene group, or a group represented by —$(CH_2)_n$— wherein n is an integer of 1 to 6; and d is 0 or 1;

(B) at least one member selected from the group consisting of compounds of the metals in Groups IA and IIA of the periodic table; and (C) an organic solvent.

2. The composition for film formation as claimed in claim 1, wherein ingredient (B) comprises a compound of at least one metal selected from the group consisting of potassium, rubidium, cesium, beryllium, magnesium, calcium, strontium, and barium.

3. The composition for film formation as claimed in claim 2, wherein the compound is a salt of an organic acid.

4. The composition for film formation as claimed in claim 1, wherein the content of ingredient (B) is from 0.0001 to 0.015 parts by weight per 100 parts by weight of ingredient (A) in terms of the product of complete hydrolysis and condensation.

5. The composition for film formation as claimed in claim 1, wherein ingredient (A) is a hydrolyzate obtained by hydrolyzing the at least one compound in the presence of at least one member selected from the group consisting of metal chelate compounds, acid catalysts, and alkali catalysts.

6. The composition for film formation as claimed in claim 1, wherein the organic solvent (C) comprises a solvent represented by the following formula (4):

$$R^8O(CHCH_3CH_2O)_e R^9 \quad (4)$$

wherein $R^8$ and $R^9$ each independently represents a hydrogen atom or a monovalent organic group selected from the group consisting of alkyl groups having 1 to 4 carbon atoms and $CH_3CO$—; and e is an integer of 1 or 2.

7. A method of film formation which comprises applying the composition for film formation as claimed in claim 1 to a substrate and then heating the resulting coating.

8. A silica-based film obtained by the method of film formation as claimed in claim 7.

* * * * *